United States Patent
Momose et al.

(10) Patent No.: US 9,079,359 B2
(45) Date of Patent: Jul. 14, 2015

(54) MICROCHIP AND METHOD OF MANUFACTURING THE SAME

(75) Inventors: Shun Momose, Kyoto (JP); Hiroki Takeuchi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 597 days.

(21) Appl. No.: 13/451,722

(22) Filed: Apr. 20, 2012

(65) Prior Publication Data

US 2012/0266985 A1    Oct. 25, 2012

(30) Foreign Application Priority Data

Apr. 21, 2011  (JP) ................................. 2011-095413
May 13, 2011  (JP) ................................. 2011-108163

(51) Int. Cl.
| | |
|---|---|
| *G01N 27/403* | (2006.01) |
| *B29C 65/00* | (2006.01) |
| *B29C 65/14* | (2006.01) |
| *B29C 65/16* | (2006.01) |
| *B81C 3/00* | (2006.01) |
| *B01L 3/00* | (2006.01) |
| *B29C 65/82* | (2006.01) |
| *B29L 31/00* | (2006.01) |

(52) U.S. Cl.
CPC ......... *B29C 66/112* (2013.01); *B01L 3/502707* (2013.01); *B29C 65/1435* (2013.01); *B29C 65/1493* (2013.01); *B29C 65/1635* (2013.01); *B29C 65/1693* (2013.01); *B29C 66/114* (2013.01); *B29C 66/1122* (2013.01); *B29C 66/348* (2013.01); *B29C 66/53461* (2013.01); *B29C 66/73921* (2013.01); *B81C 3/001* (2013.01); *B01L 2200/0689* (2013.01); *B01L 2300/0816* (2013.01); *B01L 2300/0887* (2013.01); *B29C 65/1477* (2013.01); *B29C 65/1677* (2013.01); *B29C 65/8253* (2013.01); *B29C 66/30221* (2013.01); *B29C 66/30223* (2013.01); *B29C 66/81267* (2013.01); *B29L 2031/756* (2013.01); *B81B 2201/0214* (2013.01); *B81C 2201/019* (2013.01); *B81C 2203/038* (2013.01)

(58) Field of Classification Search
CPC ....................... B29C 65/1435; B01L 3/502707
USPC ......................................................... 257/253
See application file for complete search history.

(56) References Cited

U.S. PATENT DOCUMENTS

| | | | |
|---|---|---|---|
| 2008/0017306 A1* | 1/2008 | Liu et al. .................... | 156/297 |
| 2009/0142232 A1* | 6/2009 | Okada et al. ................. | 422/72 |
| 2009/0263282 A1* | 10/2009 | Kageyama et al. ........... | 422/68.1 |
| 2009/0291025 A1* | 11/2009 | Aoki .............................. | 422/68.1 |

FOREIGN PATENT DOCUMENTS

| | | |
|---|---|---|
| JP | 2006-076246 | 3/2006 |
| JP | 2006-310828 | 11/2006 |

* cited by examiner

*Primary Examiner* — Douglas Menz
(74) *Attorney, Agent, or Firm* — Fish & Richardson P.C.

(57) ABSTRACT

Provided are a microchip including a fluid circuit consisting of a space formed therein, a light-absorbing first substrate and a light-transmitting second substrate bonded onto the first substrate, and a groove, having a V-shaped section, extending parallelly to the fluid circuit on a surface of the second substrate opposite to the first substrate on a position immediately above at least part of the fluid circuit and a method of manufacturing the same.

11 Claims, 16 Drawing Sheets

LIGHT APPLIED FOR WELDING

APPLIED LIGHT
n(REFRACTIVE INDEX)

MICROCHIP AND METHOD OF MANUFACTURING THE SAME

BACKGROUND OF THE INVENTION

1. Field of the Invention

The present invention relates to a microchip and a method of manufacturing the same. More specifically, it relates to a microchip useful for a μ-TAS (Micro Total Analysis System) or the like suitably used for biochemical testing of DNA, protein, a cell, immunity, blood etc., chemical synthesis and environmental analysis and a method of manufacturing the same.

2. Description of the Background Art

In recent years, importance of sensing, detecting or determining a biosubstance such as DNA (DeoxyriboNucleic Acid), an enzyme, an antibody, protein, a virus or a cell or a chemical substance has been increased in the fields of medical treatment, health, food and drug discovery, and there have been proposed various types of biochips and microchemical chips (the biochips and the microchemical chips are hereinafter generically referred to as microchips) allowing simple measurement thereof.

A microchip of several cm to 10 cm square having a thickness of several mm to several cm allows a series of analyses or experimental operations in a laboratory. Therefore, the microchip requires a specimen and a reagent only in small quantities, is at a low cost, exhibits a high reaction rate, allows high-throughput testing or analysis, and enables the user to immediately obtain a test result at a site where he/she has collected the specimen. Such an advantageous microchip is suitably employed for biochemical testing such as a blood test, for example.

A generally known microchip is provided therein with a channel network, referred to as a fluid circuit (or a micro-fluid circuit), constituted of a plurality of sites (chambers) for performing specific treatments on a liquid such as a specimen or a reagent present in the circuit and a fine channel properly connecting the sites with each other. The microchip provided therein with the fluid circuit is employed for performing various treatments such as measurement of a specimen introduced into the fluid circuit and a reagent to be mixed therewith (i.e. movement of the specimen and the reagent to a measuring portion serving as a site for the measurement), mixing of the specimen and the reagent (i.e., movement of the specimen and the reagent to a mixing portion serving as a site for the mixing), movement of the specimen and the reagent from a certain site to another site and the like through the fluid circuit. The treatments performed in the microchip on liquids (the specimen, a specific component in the specimen, a liquid reagent, a mixture of at least two of the specimen, the specific component and the liquid reagent etc.) are hereinafter also referred to as "fluid treatments". Such various fluid treatments can be performed by applying centrifugal force to the microchip from proper directions.

The aforementioned microchip employed for performing fluid treatments by moving liquids introduced into the fluid circuit to desired positions (sites) therein through centrifugal force can be manufactured by bonding a substrate provided with a groove (recess portion) constituting the fluid circuit and a planar substrate to each other. In general, the two substrates, made of thermoplastic resin, constituting the microchip are bonded to each other by welding through photoirradiation (with a laser beam, for example) or thermocompression bonding.

For example, each of Japanese Patent Laying-Open Nos. 2006-310828 and 2006-076246 discloses a microchip having a fluid circuit formed by bonding a plurality of substrates to each other by photoirradiation or thermocompression bonding.

In welding through photoirradiation, two substrates, made of thermoplastic resin, formed by a light-transmitting substrate and a light-absorbing substrate are overlapped with each other, and light is applied to the substrates from the side of the light-transmitting substrate. When the temperatures of bonded surfaces of the substrates exceed the melting point of the thermoplastic resin due to the photoirradiation, the substrates are melted and bonded to each other.

SUMMARY OF THE INVENTION

However, the welding through photoirradiation described in Japanese Patent Laying-Open No. 2006-310828 or the like has the following problems: In the case of bonding the light-transmitting substrate and the light-absorbing substrate to each other, the light is generally applied to the whole surface of the light-transmitting substrate. If the quantity of the light applied to bonded portions (contact portions) of the light-transmitting substrate and the light-absorbing substrate, however, the substrates are defectively bonded to each other. If the quantity of the applied light is increased to an extent causing no defect on all bonded portions, on the other hand, portions other than the bonded portions are remarkably damaged. When the quantity of the applied light is increased, the fluid circuit may be so deformed that the capacity thereof fluctuates due to deformation of a measuring portion, a fine channel connecting respective portions with each other is blocked and an inner wall surface of the channel is roughened, for example. Such deformation of the fluid circuit remarkably reduces precision of testing or analysis through the microchip.

In a conventional method of manufacturing a microchip by bonding a plurality of substrates to each other, a first substrate 1 having a groove (recess portion) 10 constituting a fluid circuit and a planar second substrate 2 are bonded to each other by welding, as shown in FIG. 28A, for example. However, it is so difficult to uniformize the heights of partitions foaming groove 10 due to sinking (indentation resulting from molding shrinkage) in molding of first substrate 1 that partitions 11a and 11b lower and higher than remaining partitions 11 are formed. Therefore, a process margin in the bonding step is small, and it is difficult to bond first and second substrates 1 and 2 to each other neither too much nor too little. In other words, a defectively bonded portion 52 and a deformed portion 51 resulting from excessive welding are partially formed to result in insufficiently divided portions 50 a fluid circuit or formation of portions 50 having undesired shapes.

An object of the present invention is to provide a microchip inhibiting a fluid circuit provided therein from deformation, thereby allowing high-precision testing and analysis.

Another object of the present invention is to provide a method of manufacturing a microchip capable of inhibiting a fluid circuit formed therein from deformation.

Still another object of the present invention is to obtain a microchip having a fluid circuit of a desired shape in a high yield without forming defectively bonded portions or changed portions when manufacturing the microchip by bonding a plurality of substrates to each other.

(a) The present invention provides a microchip, including a fluid circuit consisting of a space formed therein, moving a liquid present in the fluid circuit to a desired position in the fluid circuit, including a light-absorbing first substrate and a light-transmitting second substrate bonded onto the first substrate, and further including a groove, having a V-shaped section, extending parallelly to the fluid circuit on a surface of the second substrate opposite to the first substrate on a position immediately above at least part of the fluid circuit.

Both end portions of the aforementioned V-shaped groove in the width direction are preferably positioned immediately above bonded portions where the first substrate and the second substrate are in contact with each other.

The aforementioned V-shaped groove preferably has a sectional shape of an isosceles triangle, and preferably satisfies the following expression (1):

$$L = [a \cdot \tan(\theta - \theta')]/[1 + \tan\theta \cdot \tan(\theta - \theta')] \quad (1)$$

where L represents ½ of the distance between both end portions of the V-shaped groove in the width direction, a represents the distance from a surface of the second substrate provided with the V-shaped groove to the fluid circuit, and θ represents an angle formed by a straight line connecting both end portions of the V-shaped groove in the width direction with each other and inclined surfaces constituting the groove. θ' represents an angle satisfying the following expression (2):

$$\sin\theta/\sin\theta' = n/1 \quad (2)$$

where n represents the refractive index of the second substrate.

(b) The present invention also provides a microchip, including a fluid circuit consisting of a space formed therein, moving a liquid present in the fluid circuit to a desired position in the fluid circuit, including a light-absorbing first substrate and a light-transmitting second substrate bonded onto the first substrate, in which the fluid circuit consists of a space formed by a groove provided on a surface of the second substrate closer to the first substrate and the first substrate, and the microchip further includes a tapered structure portion including a protrusion having a sectional shape of an isosceles triangle and an apical angle of 90°. This microchip may further include a groove, having a V-shaped section, extending parallelly to the fluid circuit on another surface of the second substrate opposite to the first substrate on a position immediately above at least part of the fluid circuit.

The tapered structure portion can be formed by parallelly arraying a plurality of protrusions in the form of triangular prisms having sectional shapes of isosceles triangles and apical angles of 90° or by adjacently arraying a plurality of protrusions in the form of quadrangular pyramids having sectional shapes of isosceles triangles and apical angles of 90°, for example.

(c) The present invention further provides a method of manufacturing the aforementioned microchip described in (a) or (b), including the steps of arranging the second substrate on the first substrate, welding the first substrate and the second substrate to each other by applying light to the side of the second substrate from a direction perpendicular to the surface of the second substrate opposite to the first substrate.

(d) The present invention further provides a microchip including a first substrate having a recess portion divided by a partition on at least a first surface and a second substrate bonded onto at least the first surface of the first substrate and including a fluid circuit constituted of the recess portion and a surface of the second substrate, in which at least part of a forward end of the partition of the first substrate dividing the recess portion is welded to the second substrate through a welding rib.

The welding rib preferably partially has a liquid movement preventing stopper longer than the remaining portion in the thickness direction of the partition.

(e) The present invention further provides a method of manufacturing a microchip including a molding step of molding a first substrate having a recess portion divided by a partition wall on at least a first surface, a stacking step of stacking a second substrate on at least the first surface of the first substrate and a bonding step of bonding the first substrate and the second substrate to each other by welding a forward end of the partition of the first substrate to the second substrate for forming a fluid circuit constituted of the recess portion and a surface of the second substrate, in which a welding rib is formed on at least part of the forward end of the partition of the first substrate dividing the recess portion, and the partition dividing the recess portion is welded to the second substrate through the welding rib in the bonding step.

The welding rib preferably partially has a liquid movement preventing stopper longer than the remaining portion in the thickness direction of the partition after the bonding step.

The welding rib preferably partially has an additional portion longer than the remaining portion in the thickness direction of the partition or an additional portion longer than the remaining portion in the height direction of the partition before the bonding step.

The partition of the first substrate preferably partially has a positioning step formed by a projecting portion higher than the remaining portion of the partition and lower than the forward end of the welding rib before the bonding step.

According to the present invention, a microchip, formed by bonding substrates to each other by welding through photoirradiation, inhibiting a fluid circuit provided therein from deformation can be provided.

According to the present invention, further, a microchip provided with a fluid circuit having a desired shape can be provided by welding substrates to each other through a welding rib, without forming defectively bonded portions or changed portions. In addition, the microchip provided with such a fluid circuit having a desired shape can be obtained with a high yield.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
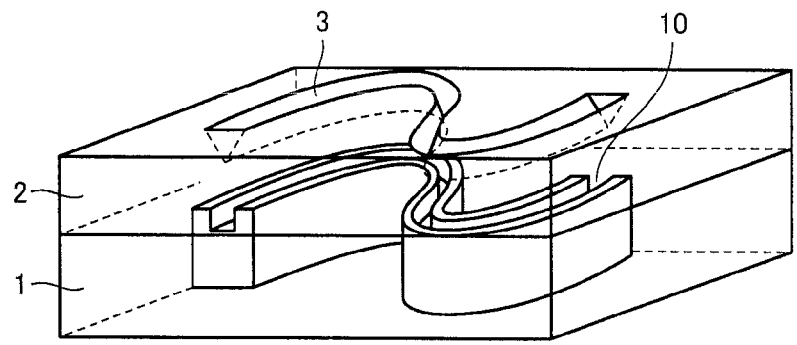
FIG. 1 is a perspective view conceptually showing a microchip according to a first embodiment of the present invention.

A microchip according to the present invention is employed for performing chemical synthesis, testing or analysis through a fluid circuit (space formed therein) provided therein. With the microchip according to the present invention, a proper fluid treatment can be performed on a liquid (a specimen, a specific component in the specimen, a liquid reagent, a mixture of at least two thereof or the like) in the fluid circuit by moving the liquid to a prescribed position (site) in the fluid circuit through application of centrifugal force. The fluid circuit includes various sites (chambers) arranged on proper positions, and these sites are properly connected with each other through a fine channel.

For example, the fluid circuit can include a reagent holding portion for holding a reagent to be mixed (or reacted) with a specimen employed as an object of testing or analysis, a separating portion for extracting a specific component from the specimen introduced into the fluid circuit, a specimen measuring portion for measuring the specimen (including the specific component: this also applies to the following description), a reagent measuring portion for measuring the reagent, a mixing portion for mixing the specimen and the reagent with each other, a detecting portion (cuvette for optical measurement) for testing or analyzing the obtained mixed liquid (detecting or determining the specific component in the mixed liquid, for example) as the aforementioned sites (chambers).

A method of the testing or the analysis is not particularly restricted, but optical measurement such as a method of applying light to the detecting portion storing the mixed liquid for detecting the intensity (transmittance) of transmitted light or a method of measuring an absorption spectrum as to the mixed liquid held in the detecting portion can be employed, for example.

The microchip according to the present invention may have all of the aforementioned sites, or may not have at least any one thereof. Further, the microchip may have further sites, in addition to the aforementioned sites.

The term "specimen" denotes a substance, such as whole blood, blood plasma, urine or saliva, for example, introduced into the fluid circuit as the object of the testing or the analysis performed through the microchip. The term "reagent" denotes a substance (typically a liquid) for treating the specimen subjected to the testing or the analysis performed through the microchip or to be mixed or reacted with the specimen, and the reagent is generally previously stored in the reagent holding portion of the fluid circuit before the microchip is used.

Various fluid treatments such as extraction of the specific component (separation of an unnecessary component) from the specimen, measurement of the specimen and/or the reagent, mixing of the specimen and the reagent, introduction of the obtained mixed liquid into the detecting portion and the like in the fluid circuit can be performed by successively applying centrifugal force to the microchip from proper directions.

The centrifugal force can be applied to the microchip by setting the microchip in an apparatus (centrifugal machine) capable of applying centrifugal force. The centrifugal machine can include a rotatable rotor (rotator) and a rotatable stage arranged on the rotor. Centrifugal force of an arbitrary direction can be applied to the microchip by placing the microchip on the stage, rotating the stage and arbitrarily setting the angle of the microchip with respect to the rotor.

The size of the microchip is not particularly restricted, but the microchip may be about several cm to 10 cm in length and breadth and about several mm to several cm in thickness, for example.

The present invention is now described in detail with reference to embodiments.

First Embodiment

FIG. 1 is a perspective view conceptually showing a microchip according to a first embodiment of the present invention. As shown in FIG. 1, the microchip according to the first embodiment includes a light-absorbing first substrate 1 and a light-transmitting second substrate 2 bonded onto first substrate 1. First and second substrates 1 and 2 are bonded to each other by welding with light (a laser beam, lamplight or the like) applied to the side of second substrate 2. In other words, first and second substrates 1 and 2 are bonded to each other by melting a bonded surface of light-absorbing first substrate 1 with light transmitted through second substrate 2 to reach the interface between first and second substrates 1 and 2.

Referring to FIG. 1, a groove (recess portion) 10 constituting a fluid circuit is provided on a surface of first substrate 1 closer to second substrate 2, so that groove 10 and second substrate 2 form the fluid circuit (internal space). A groove 3, having a V-shaped section, extending parallelly to the fluid circuit is provided on a surface (outer surface) of second substrate 2 opposite to first substrate 1 on a position immediately above the fluid circuit.

The microchip according to the first embodiment having groove 3 on the surface of second substrate 2 is extremely advantageous in the following points:

(I) Groove 3 effectively functions as a shielding means preventing the light applied for welding first and second substrates 1 and 2 to each other from being applied to groove 10, constituting the fluid circuit, positioned immediately under groove 3. Thus, the fluid circuit can be inhibited from deformation of the fluid circuit (deformation of respective sites, deformation or blocking of a channel connecting the sites with each other, roughening of inner wall surfaces of the sites or the channel etc., for example), thereby allowing high-precision testing or analysis. Such a shielding effect is remarkably effective for preventing deactivation of a carried substance such as an immobilized antibody carried in the fluid circuit as necessary in response to the type of the testing or the analysis.

(II) The light applied to groove 3 for welding first and second substrates 1 and 2 is refracted by groove 3, and condensed on bonded portions where first and second substrates 1 and 2 are in contact with each other. Thus, the quantity of the light reaching the bonded portions (contact portions) of first and second substrates 1 and 2 can be increased without increasing the intensity of irradiation of a light source or the time for applying the light, whereby adhesiveness between first and second substrates 1 and 2 can be improved. Further, the time for applying the light may not be increased, whereby productivity can be improved.

Also when the light is uniformly applied over the whole of second substrate 2 in this manner, light applied toward a region (region where groove 10 constituting the fluid circuit is present) requiring no photoirradiation can be directed to the bonded portions of first and second substrates 1 and 2, whereby prevention of deformation of the fluid circuit and improvement of the adhesiveness between first and second substrates 1 and 2 can be simultaneously achieved.

Figure 2:
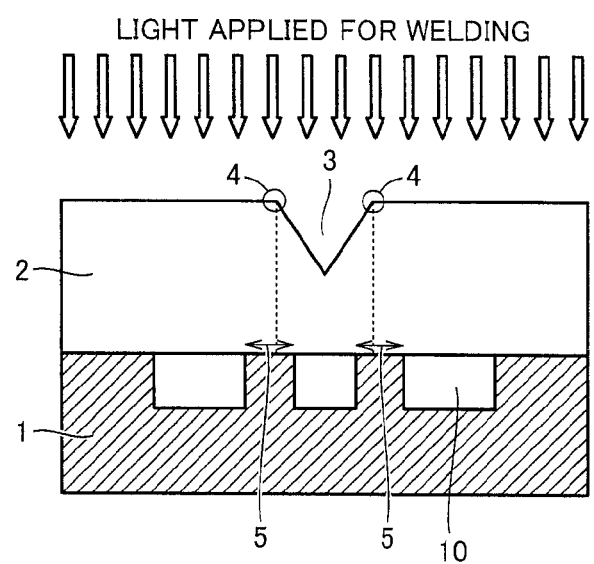
FIG. 2 is a schematic sectional view showing an example of the microchip according to the first embodiment of the present invention.
Figure 3:
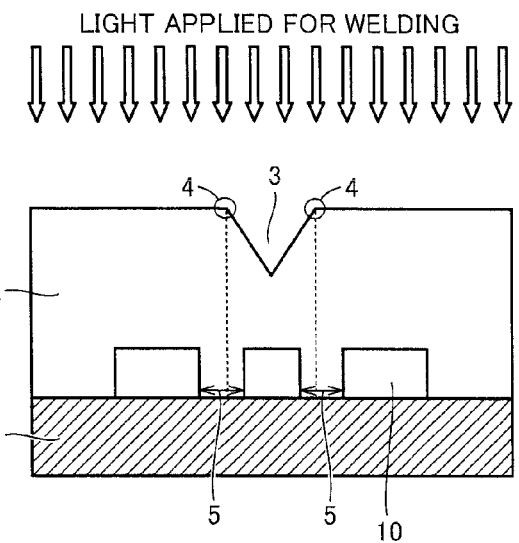
FIG. 3 is a schematic sectional view showing another example of the microchip according to the first embodiment of the present invention.

FIGS. 2 and 3 are schematic sectional views more specifically showing examples of the microchip according to the first embodiment. In the exemplary microchip shown in FIG. 2, a groove (recess portion) 10 constituting a fluid circuit is provided on a surface of a light-absorbing first substrate 1 closer to a second substrate 2, similarly to the microchip shown in FIG. 1. In the exemplary microchip shown in FIG. 3, on the other hand, a groove 10 constituting a fluid circuit is provided on a surface of a light-transmitting second substrate 2 closer to a first substrate 1. Thus, groove 10 constituting the fluid circuit may be formed on either first substrate 1 or second substrate 2.

Referring to each of FIGS. 2 and 3, light for welding first and second substrates 1 and 2 to each other applied to the side of second substrate 2 from a direction perpendicular to a surface (having a groove 3) of second substrate 2 opposite to first substrate 1 is refracted by groove 3 and prevented from being applied to groove 10, positioned immediately under groove 3, constituting the fluid circuit, and the refracted light is condensed on bonded portions 5 where first and second substrates 1 and 2 are in contact with each other, as described above. Thus, the aforementioned effects are attained.

Referring to each of FIGS. 2 and 3, both of end portions 4 of groove 3, having the V-shaped section, in the width direction are preferably positioned immediately above bonded portions 5 where first and second substrates 1 and 2 are in contact with each other. Thus, groove 10 positioned immediately under groove 3 can be prevented from deformation over the whole fluid circuit.

Figure 4:
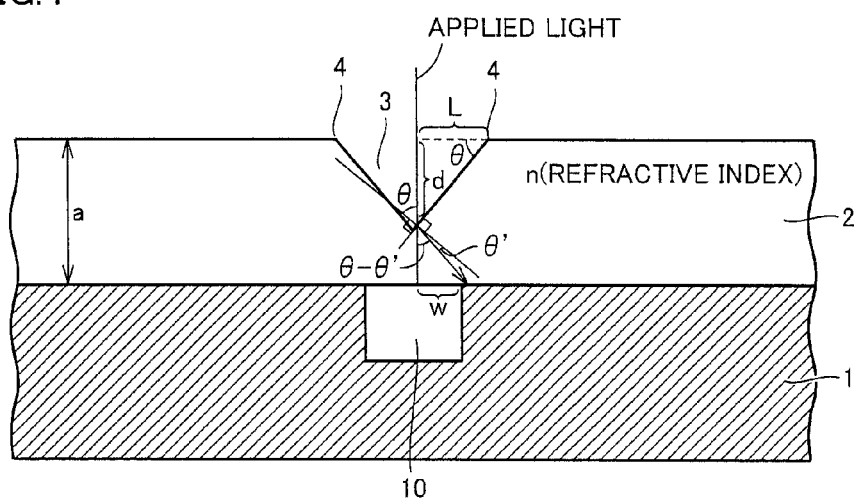
FIG. 4 is a schematic sectional view for illustrating factors preferably satisfied by a groove having a V-shaped section in relation to the shape thereof.

The sectional shape, which is triangular, of groove 3 having the V-shaped section is preferably in the form of an isosceles triangle, so that the same can isotropically refract the light with two inclined surfaces. Referring to FIG. 4, a groove 3 having a section in the form of an isosceles triangle preferably satisfies the following expression (1) in relation to the shape thereof:

$$L = [a \cdot \tan(\theta - \theta')]/[1 + \tan\theta \cdot \tan(\theta - \theta')] \quad (1)$$

where L represents ½ of the distance between end portions 4 of V-shaped groove 3 in the width direction. a represents the distance from a surface of a second substrate 2 provided with V-shaped groove 3 to a fluid circuit (groove 10), and corresponds to the thickness of second substrate 2 when groove 10 constituting the fluid circuit is provided on a first substrate 1 as in an exemplary microchip shown in FIG. 4. θ represents an angle formed by a straight line connecting end portions 4 of V-shaped groove 3 in the width direction with each other and inclined surfaces constituting groove 3. θ' represents an angle satisfying the following expression (2):

$$\sin\theta/\sin\theta' = n/1 \quad (2)$$

where n represents the refractive index of second substrate 2.

The shape of V-shaped groove 3 preferably satisfies the above expression (1) for the following reason: A region (shielded region) shielded by V-shaped groove 3 serving as a shielding means is preferably as wide as possible, in order to attain the maximum shielding effect. Referring to FIG. 4, the shielded region can be expressed as min(w, L) assuming that w represents the distance between a position on the interface between first and second substrates 1 and 2 where light applied to the vicinity of the apex of groove 3 (apex of the V-shaped section) reaches upon rectilinear progress and a position on the interface between first and second substrates 1 and 2 where light refracted by the inclined surfaces of groove 3 reaches in practice. In other words, the shielded region is decided by the smaller one of the distances w and L, and the shielding effect is preferably improved as both of the distances w and L are increased.

Considering light applied to the vicinity of the apex of groove 3 from a direction perpendicular to the surface (provided with groove 3) of second substrate 2, the angle of incidence of the light upon the inclined surfaces of groove 3 is identical to the angle θ angle formed by the straight line connecting end portions 4 of groove 3 in the width direction with each other and the inclined surfaces of groove 3, and satisfies the relation of the following expression [a] along with the angle θ' of refraction of the light refracted by the inclined surfaces:

$$\sin\theta/\sin\theta' = n/1 \quad [a]$$

This expression [a] is identical to the above expression (2).

Assuming that d represents the distance from the straight line connecting end portions 4 of groove 3 in the width direction to the point of contact between the applied light and the inclined surfaces of groove 3, the following relational expressions [b] and [c] are guided from FIG. 4:

$$\tan\theta = d/L \quad [b]$$

$$\tan(\theta-\theta') = w/(a-b) \quad [c]$$

On the other hand, the value min(w, L) representing the shielded region is maximized when the relation of the following expression [d] is satisfied:

$$W = L \quad [d]$$

From the above expressions [b] to [d], therefore, the shielded region min(w, L) is maximized when the above expression (1) is satisfied.

When a light-transmitting substrate having a thickness of 1.5 mm (i.e., a=1.5 mm) made of polystyrene (refractive index n=1.59) is employed as second substrate 2 in the microchip shown in FIG. 4, for example, the distance w exhibits the maximum value of 0.41 mm when the angle θ is 56.8° from the above expression (1).

Figure 5:
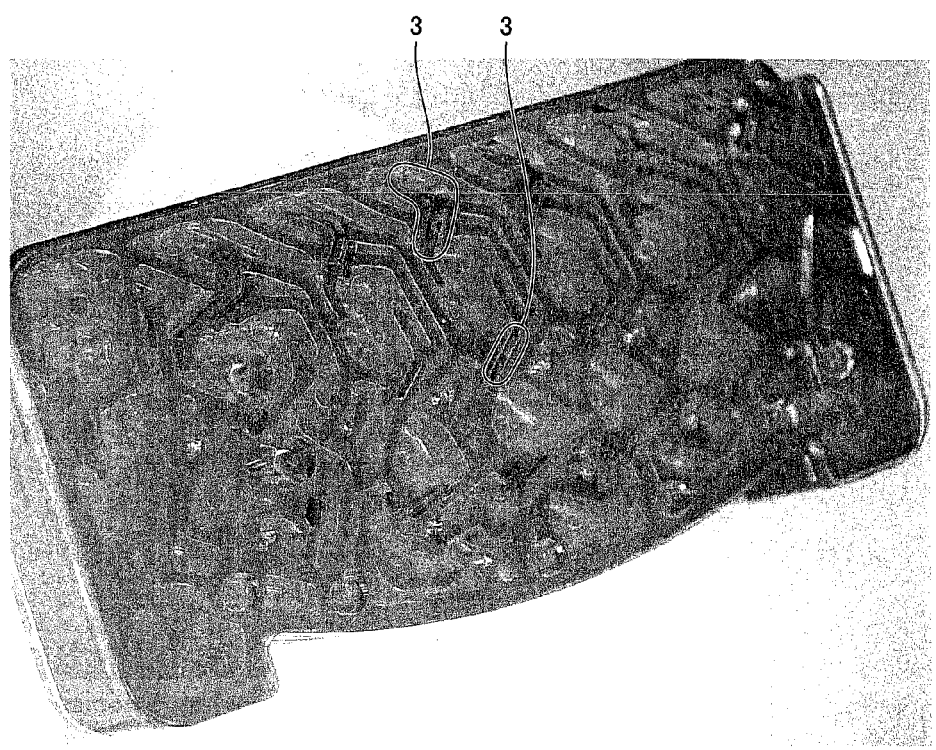
FIG. 5 is a photograph showing a microchip according to the first embodiment of the present invention prepared in practice.

FIG. 5 is a photograph showing a microchip according to the first embodiment prepared in practice. In the microchip shown in FIG. 5, grooves 3 having V-shaped sections are provided immediately above a specimen measuring portion for measuring a blood plasma component separated from whole blood and a channel connecting a reagent holding portion holding a reagent to be mixed with the blood plasma component and a reagent measuring portion for measuring the reagent in a fluid circuit. Thus, grooves 3 may simply be provided immediately above at least partial portions, such as portions particularly desirably shielded, of the fluid circuit.

The portions particularly desirably shielded are the specimen measuring portion for measuring a specimen (including a specific component in the specimen), the reagent measuring portion for measuring the reagent, a narrow channel, a portion where a carried substance such as an immobilized antibody is present and the like, for example.

Figure 6:
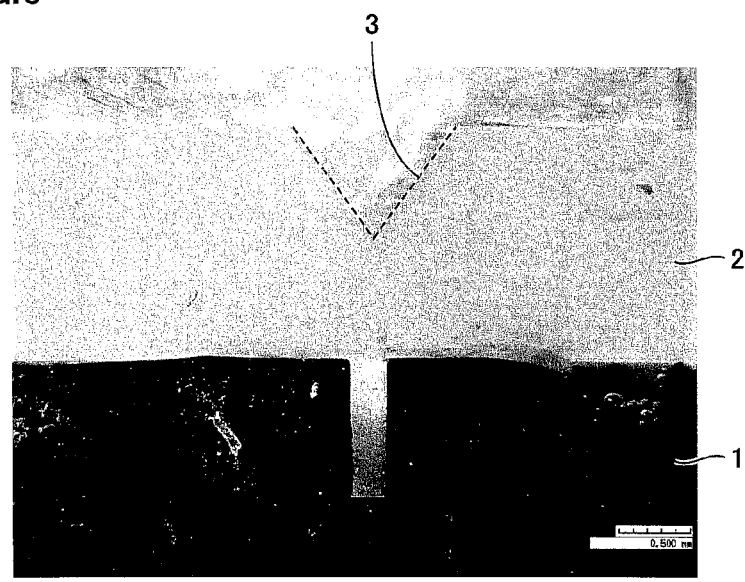
FIG. 6 is a photograph showing a section of an example of a substrate laminate, prepared for an experiment for verifying effects of provision of the groove having the V-shaped section, including a first substrate provided with a groove constituting a fluid circuit and a second substrate having an outer surface provided with a groove having a V-shaped section.

FIG. 6 is a photograph showing a section of an exemplary substrate laminate, having a first substrate 1 provided with a groove constituting a fluid circuit and a second substrate 2 provided with a groove 3 on a surface (outer surface) thereof, prepared for an experiment for verifying effects of the provision of groove 3 having a V-shaped section. FIGS. 7 to 10 are photographs showing results of the experiment for verifying the effects of the provision of groove 3 having a V-shaped section through sections of substrate laminates. The substrate laminate shown in FIG. 6 was obtained by stacking transparent second substrate 2 (made of polystyrene) having a thickness of 1.6 mm on black first substrate 1 (made of polystyrene containing carbon black dispersed therein), having a thickness of 5 mm, provided on one surface thereof with a groove (250 μm in width and 1000 μm in depth) having a quadrangular section. Second substrate 2 is provided with groove 3 (having a distance of 534 μm between end portions in the width direction thereof, a maximum depth of 800 μm and an apical angle of 67.4°) having a V-shaped section immediately above the groove of first substrate 1.

Figure 7:
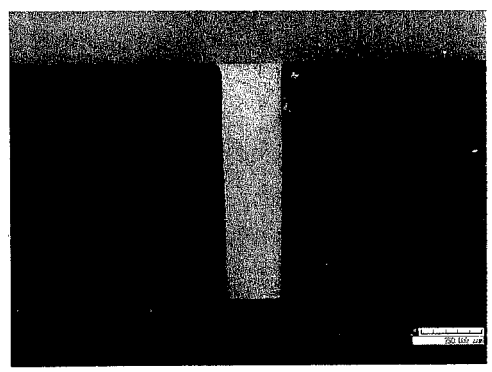
FIG. 7 is a photograph showing a result of the experiment for verifying the effects of the provision of the groove having the V-shaped section (with a V-shaped groove)

A laser beam having a wavelength of 940 μm and power of 30 W was applied to the side of second substrate 2 of the substrate laminate shown in FIG. 6 from a direction perpendicular to the outer surface (having groove 3) of second substrate 2 at a scanning speed of 20 mm/sec. FIG. 7 shows the result. As shown in FIG. 7, the quadrangular groove was neither deformed nor blocked.

Figure 8:
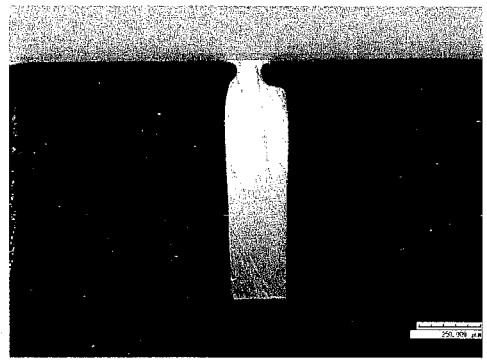
FIG. 8 is a photograph showing another result of the experiment for verifying the effects of the provision of the groove having the V-shaped section (with no V-shaped groove)

On the other hand, another substrate laminate prepared similarly to the substrate laminate shown in FIG. 6 without forming a groove 3 was subjected to application of a laser beam, similarly to the above. As a result, a quadrangular groove was remarkably deformed in the vicinity of the interface between first and second substrates 1 and 2, as shown in FIG. 8.

Figure 9:
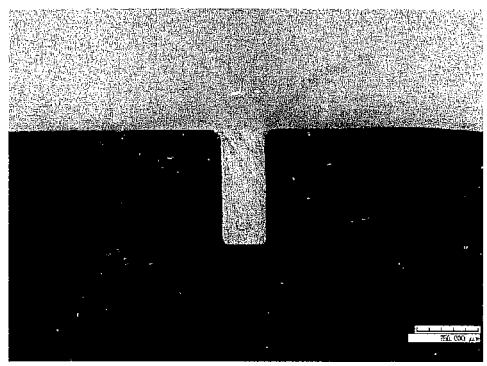
FIG. 9 is a photograph showing still another result of the experiment for verifying the effects of the provision of the groove having the V-shaped section (with a V-shaped groove)

Further, still another substrate laminate (provided with a groove 3 having a V-shaped section) prepared similarly to the substrate laminate shown in FIG. 6 except that a quadrangular groove had a width of 180 μm and a depth of 480 μm was subjected to application of a laser beam similarly to the above. As a result, the quadrangular groove was neither deformed nor blocked, as shown in FIG. 9.

Figure 10:
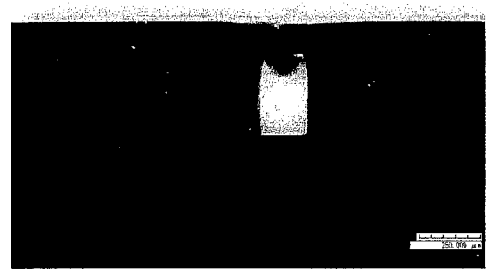
FIG. 10 is a photograph showing a further result of the experiment for verifying the effects of the provision of the groove having the V-shaped section (with no V-shaped groove)

A further substrate laminate prepared similarly to the substrate laminate shown in FIG. 6 without forming a groove 3 while providing a quadrangular groove having a width of 180 μm and a depth of 480 μm was subjected to application of a laser beam similarly to the above. As a result, the quadrangular groove was blocked, as shown in FIG. 10.

Thus, it has been confirmed that the fluid circuit can be effectively prevented from deformation and blocking by providing groove 3 having the V-shaped section on the outer surface of light-transmitting second substrate 2 on the position immediately above groove (recess portion) 10 constituting the fluid circuit.

A method of manufacturing the microchip according to the first embodiment and substrates employed for the microchip are now described. The microchip according to the first embodiment can be suitably manufactured by a method including the steps of:

(A) arranging light-transmitting second substrate 2 on light-absorbing first substrate 1; and (B) welding first and second substrates 1 and 2 to each other by applying light to the side of second substrate 2 from a direction perpendicular to the surface of second substrate 2 opposite to first substrate 1.

According to the aforementioned method, groove 10, constituting the fluid circuit, positioned immediately under groove 3 can be prevented from application of light applied for welding first and second substrates 1 and 2 to each other due to the presence of groove 3 having the V-shaped section, whereby the fluid circuit can be effectively inhibited from deformation. Further, the light applied to groove 3 for welding first and second substrates 1 and 2 to each other is refracted by groove 3 and condensed on bonded portions 5 where first and second substrates 1 and 2 are in contact with each other, whereby the quantity of light reaching bonded portions (contact portions) 5 of first and second substrates 1 and 2 can be increased without increasing the intensity of irradiation of a light source or the time for applying the light, whereby adhesiveness between first and second substrates 1 and 2 can be improved. In addition, the time for applying the light may not be increased, whereby productivity can be improved.

First substrate 1 is a light-absorbing substrate, and can be made of thermoplastic resin containing a light-absorbing substance, generating heat by absorbing light, dispersed therein, for example. The light-absorbing substance can be prepared from a pigment, for example, and particularly preferably prepared from carbon black. The light-absorbing substance may simply be dispersed on the bonded surface of at least first substrate 1. For example, a layer containing the light-absorbing substance dispersed therein may be formed on the side of the bonded surfaces of first and second substrates 1 and 2, or the light-absorbing substance may be dispersed in the whole of first substrate 1.

Second substrate 2 is made of light-transmitting thermoplastic resin. The thermoplastic resin employed for first and second substrates 1 and 2 can be prepared from polyethylene terephthalate (PET), polyethylene naphthalate (PEN), polybutylene terephthalate (PBT), polymethyl methacrylate (PMMA), polycarbonate (PC), polystyrene (PS), polypropylene (PP), polyethylene (PE), polyallylate resin (PAR), acrylonitrile-butadiene-styrene resin (ABS), styrene-butadiene resin (styrene-butadiene copolymer), a biodegradable polymer (BP), a cycloolefin polymer (COP), polydimethyl siloxane (PDMS), polyacetal (POM) or polyamide (PA), for example.

First and second substrates 1 and 2, which may be made of different types of thermoplastic resin, are preferably made of the same type of thermoplastic resin. When first and second substrates 1 and 2 are made of the same type of thermoplastic resin, the bonded surfaces of first and second substrates 1 and 2 are simultaneously melted by photoirradiation, whereby adhesive strength can be further increased.

The sizes of first ands second substrates 1 and 2 are not particularly restricted, but first ands second substrates 1 and 2 may be about several cm to 10 cm in length and breadth and about several mm to several cm in thickness, for example.

Groove (recess portion) 10 constituting the fluid circuit may be provided on the surface of first substrate 1 or on the surface of second substrate 2, as shown in FIG. 2 or 3. Alternatively, grooves 10 may be provided on both of first and second substrates 1 and 2, as the case may be.

A method of forming groove 10 constituting the fluid circuit on the surface of either substrate 1 or 2 is not particularly restricted, but groove 10 can be formed by injection molding employing a mold having a transfer structure, imprinting or the like. The fluid circuit of the microchip consists of a hollow portion constituted of groove (recess portion) 10 provided on the surface of first substrate 1 and a surface of second substrate 2 opposed to first substrate 1. The shape (pattern) of groove (recess portion) 10 is so decided as to obtain a desired proper fluid circuit structure. Groove 3 having the V-shaped section provided on the surface of second substrate 2 can also be formed by a method similar to the above.

In the aforementioned step (A), second substrate 2 is arranged on first substrate 1. Then, in the aforementioned step (B), a glass plate or the like is arranged on second substrate 2, and first and second substrates 1 and 2 are welded by applying light (a laser beam or lamplight, for example) is applied to the side of second substrate 2 (glass plate) from a direction perpendicular to the surface of second substrate 2 while applying pressure to first and second substrates 1 and 2 through the glass plate or the like. The pressure is so applied that first and second substrates 1 and 2 can be welded in a state brought into close contact with each other with no clearance. The light-absorbing substance generates heat due to the photoirradiation to melt the bonded portion of first substrate 1, and that of second substrate 2 as the case may be, thereby welding first and second substrates 1 and 2 to each other.

The applied light is not particularly restricted so far as the light-absorbing substance such as carbon black can relatively efficiently heat the bonded portions by absorbing the light. For example, a laser beam having a wavelength of about 0.8 to 1.1 μm and power of about 10 to 1000 W can be employed as the light.

While the first embodiment has been described mainly with reference to the microchip formed by two substrates, i.e., first and second substrates 1 and 2, the present invention is not restricted to this. Alternatively, the microchip may have a multilayer structure of a light-absorbing first substrate having grooves (recess portions) constituting a fluid circuit on both surfaces thereof and light-transmitting second and third substrates stacked on the first substrate to hold the first substrate therebetween, for example. In this case, the fluid circuit can have a two-layer structure of a first fluid circuit constituted of the second substrate and the groove provided on the surface of the first substrate closer to the second substrate and a second fluid circuit constituted of the third substrate and the groove provided on the surface of the first substrate closer to the third substrate. The term "two-layer" denotes that fluid circuits are provided on two different positions in relation to the thickness direction of the microchip. Such two-layer fluid circuits can be connected with each other by a through-hole passing through the first substrate in the thickness direction. The microchip shown in FIG. 5 consists of such three substrates.

Second Embodiment

Figure 11:
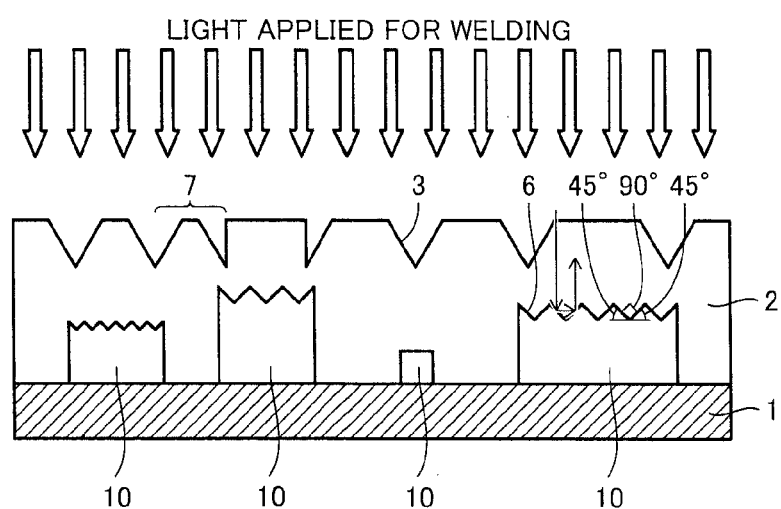
FIG. 11 is a schematic sectional view showing an example of a microchip according to a second embodiment of the present invention.

FIG. 11 is a schematic sectional view showing an exemplary microchip according to a second embodiment of the present invention. As shown in FIG. 11, the microchip according to the second embodiment includes a light-absorbing first substrate 1 and a light-transmitting second substrate 2 bonded onto first substrate 1. First and second substrates 1 and 2 are bonded to each other by welding with light (a laser beam, lamplight or the like) applied to the side of second substrate 2, similarly to the aforementioned first embodiment.

According to the second embodiment, a groove (recess portion) 10 constituting a fluid circuit is provided on a surface of light-transmitting second substrate 2 closer to first substrate 1, to form the fluid circuit (internal space) along with first substrate 1. A tapered structure portion 6 including protrusions having sections in the form of isosceles triangles and apical angles of 90° (tapered protrusions having sectional shapes tapered by 45° with respect to the surface of second substrate 2) is provided on a bottom surface of groove 10. The term "bottom surface of groove 10" denotes an inner wall surface of substantially quadrangular groove 10 closer to an outer surface (major surface opposite to first substrate 1) of second substrate 2, and this inner wall surface is substantially parallel to the outer surface of second substrate 2 in general.

Such tapered structure portion 6 is so provided on the bottom surface of groove 10 as to totally reflect light applied to the side of second substrate 2 from a direction perpendicular to the surface of second substrate 2 opposite to first substrate 1 for welding first and second substrates 1 and 2, whereby the fluid circuit, particularly an inner wall surface (consisting of light-absorbing first substrate 1) opposed to tapered structure portion 6, can be effectively inhibited from deformation, to allow high-precision testing and analysis. Such a shielding effect is remarkably effective for preventing deactivation of a carried substance such as an immobilized antibody carried in the fluid circuit as necessary in response to the type of the testing or the analysis.

Tapered structure portion 6 can be formed by parallelly arraying a plurality of protrusions in the form of triangular prisms having sectional shapes of isosceles triangles and apical angles of 90° or by adjacently (e.g. vertically and horizontally) arraying a plurality of protrusions in the form of quadrangular pyramids having sectional shapes of isosceles triangles and apical angles of 90°.

Tapered structure portion 6 may simply be provided immediately above partial portions, such as portions particularly desirably to be shielded, of the fluid circuit, similarly to groove 3 having the V-shaped section in the aforementioned first embodiment. The portions particularly desirably to be shielded are a specimen measuring portion for measuring a specimen (including a specific component therein), a reagent measuring portion for measuring a reagent, a narrow channel, a portion where a carried substance such as an immobilized antibody is present and the like, for example.

An experiment for verifying effects of the provision of tapered structure portion 6 has been conducted by preparing a substrate laminate consisting of first and second substrates 1 and 2, as follows:

The substrate laminate was obtained by stacking transparent second substrate 2 (made of polystyrene), having a thickness of 5 mm, provided on one surface with a groove (5000 µm in width and 3000 µm in depth), having a substantially quadrangular section, constituting a fluid circuit on black first substrate 1 (made of polystyrene containing carbon black dispersed therein) having a thickness of 1.5 mm so that the surface provided with the groove was opposed to first substrate 1. A tapered structure portion 6 formed by parallelly adjacently arraying three linear protrusions in the form of triangular prisms having bottom surfaces of 1 mm in width and 3 mm in length and apical angles of 90° was provided on a partial bottom surface of the groove of second substrate 2. A laser beam having a wavelength of 940 µm and power of 30 W was applied to the substrate laminate on the side of second substrate 2 from a direction perpendicular to the outer surface of second substrate 2 at a scanning speed of 20 m/sec. The degree of roughening of an inner wall surface (consisting of first substrate 1) of the fluid circuit opposed to the bottom surface of the groove of second substrate 2 was measured with a laser microscope. While surface roughness Ra (arithmetic mean roughness) of a portion of the inner wall surface immediately under a region provided with tapered structure portion 6 was 3.7 µm, surface roughness Ra of a portion of the inner wall surface immediately under a region provided with no tapered structure portion 6 was 130.8 µm.

Thus, it has been confirmed that the fluid circuit, particularly the inner wall surface opposed to tapered structure portion 6, can be effectively inhibited from deformation by providing tapered structure portion 6 on the bottom surface of groove 10 constituting the fluid circuit.

The microchip according to the second embodiment may be provided with a groove 3 having a V-shaped section similar to that of the aforementioned first embodiment on the outer surface of second substrate 2 on a position immediately above groove 10 constituting the fluid circuit, as shown in FIG. 11. Thus, the aforementioned effects (I) and (II) can be further attained.

Further, the microchip according to the second embodiment may include a condensing portion 7 provided above a bonded portion 5 of the outer surface of second substrate 2 where first and second substrates 1 and 2 are in contact with each other. Condensing portion 7 includes inclined surfaces inclined from the outer surface of second substrate 2. Such condensing portion 7 is so provided that light applied to a region (where groove 10 constituting the fluid circuit is present) requiring no photoirradiation can be directed to bonded portions 5 of first and second substrates 1 and 2, whereby adhesiveness between first and second substrates 1 and 2 can be improved, and the fluid circuit can be prevented from deformation.

A method of manufacturing the microchip according to the second embodiment is similar to that for the microchip according to the aforementioned first embodiment, and the microchip can be suitably manufactured by a method including the aforementioned steps (A) and (B). The structures of and the materials for substrates 1 and 2 employed for the microchip are also similar to those in the aforementioned first embodiment, except that tapered structure portion 6 is provided and the fluid circuit is formed in light-transmitting second substrate 2. Tapered structure portion 6 can be formed by injection molding employing a mold having a transfer structure, imprinting or the like.

Also in the second embodiment, the number of substrates 1 and 2 constituting the microchip is not restricted to two, but the microchip may have a multilayer structure of a light-absorbing first substrate having grooves (recess portions) constituting a fluid circuit on both surfaces thereof and light-transmitting second and third substrates stacked on the first substrate to hold the first substrate therebetween, for example.

Third Embodiment

A microchip according to a third embodiment of the present invention is constituted of a first substrate having a recess portion (groove) divided by partitions on at least a first surface and a second substrate bonded onto at least the first surface of the first substrate. A fluid circuit of the microchip includes a space constituted of the aforementioned recess portion (groove) and a surface of the second substrate. The surface (bonded to the first substrate) of the second substrate may be planar, or may be provided with a recess portion corresponding to that of the first substrate.

The microchip according to the third embodiment (and microchips according to fourth and fifth embodiments described later) may alternatively be constituted of at least three substrates. For example, the first substrate may have another recess portion also on a surface opposite to the second substrate, and a third substrate similar to the second substrate may be bonded to the side of this recess portion. In this case, the fluid circuit has a two-layer structure of a first fluid circuit consisting of a space constituted of the recess portion provided on the surface of the first substrate closer to the second substrate and a surface of the second substrate and a second fluid circuit consisting of a space constituted of the recess portion provided on the surface of the first substrate closer to the third substrate and a surface of the third substrate. Such two-layer fluid circuits can be connected with each other by a through-hole passing through the first substrate in the thickness direction.

According to the third embodiment (and the fourth and fifth embodiments described later), the substrates are bonded to each other by a method (welding) of melting and welding a bonded surface of at least one of the substrates to be bonded to each other. The bonded surface can be welded by a method of welding the substrate by heating the same, a method (laser welding, lamp welding or the like) of applying light emitted by a laser unit, a lamp or an LED to the substrate for welding the bonded surface by heat generated in light absorption, a method (ultrasonic welding) of welding the bonded surface with ultrasonic waves or the like.

The material for at least one of the aforementioned substrates constituting the microchip according to the third embodiment (and the fourth and fifth embodiments described later) is thermoplastic resin. The materials for all substrates are preferably thermoplastic resin, and the materials for all substrates are more preferably the same type of thermoplastic resin. The thermoplastic resin can be prepared from polyethylene terephthalate (PET), polyethylene naphthalate (PEN), polybutylene terephthalate (PBT), polymethyl methacrylate (PMMA), polycarbonate (PC), polystyrene (PS), polypropylene (PP), polyethylene (PE), polyallylate resin (PAR), acrylonitrile-butadiene-styrene resin (ABS), styrene-butadiene resin (styrene-butadiene copolymer), polyvinyl chloride resin (PVC), polymethyl pentene resin (PMP), polybutadiene resin (PBD), a biodegradable polymer (BP), a cycloolefin polymer (COP), polydimethyl siloxane (PDMS), polyacetal (POM) or polyamide (PA), for example.

When the microchip is constituted of the first substrate including the recess portion on the surface thereof and the second substrate, the first substrate, including sites irradiated with detection light in optical measurement, is preferably formed by a transparent substrate. The second substrate, which may be formed by either a transparent substrate or an opaque substrate, is preferably formed by an opaque substrate and more preferably formed by a black substrate (made of resin containing a black pigment such as carbon black, for example) when the first and second substrates are welded by laser welding, so that light absorptivity can be increased.

When the microchip is constituted of the first substrate including the recess portions on both surfaces, the second substrate and the third substrate, the first substrate is preferably formed by an opaque substrate and more preferably formed by a black substrate, in consideration of efficiency of laser welding. On the other hand, the second and third substrates are preferably formed by transparent substrates, in order to construct a detecting portion. When the second and third substrates are formed by transparent substrates, the detecting portion (cuvette for optical measurement) can be constituted of a through-hole provided on the first substrate and the transparent second and third substrates, so that optical measurement can be performed by applying light to the detecting portion from a direction substantially perpendicular to the surface of the microchip and detecting intensity (transmittance) of transmitted light.

A method of forming the recess portion (patterned groove) and the partitions constituting the fluid circuit on the surface of the first substrate is not particularly restricted, but the recess portion and the partitions can be formed by injection molding employing a mold having a transfer structure, imprinting or the like. The shapes of the recess portion and the partitions are so decided as to obtain a proper fluid circuit structure.

Figure 12A:
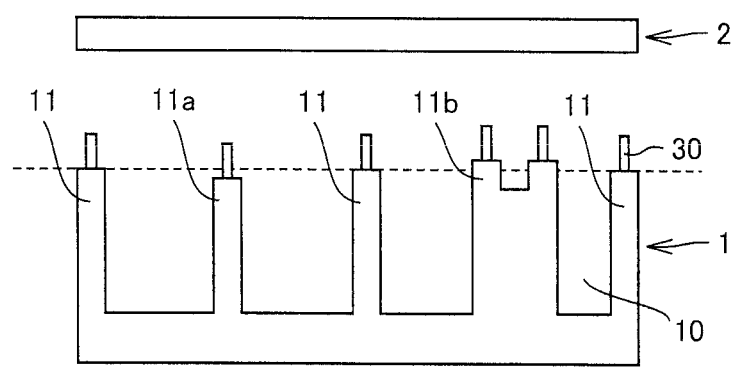
FIG. 12A is a schematic sectional view showing a step of manufacturing a microchip according to a third embodiment of the present invention in a state before bonding substrates to each other.
Figure 12B:
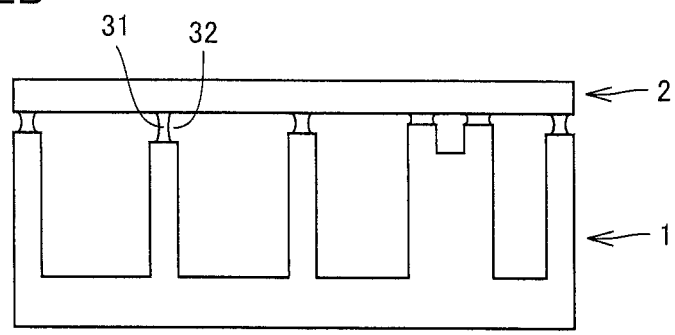
FIG. 12B is a schematic sectional view showing another step of manufacturing the microchip according to the third embodiment of the present invention in a state after bonding the substrates to each other.
Figure 28A:
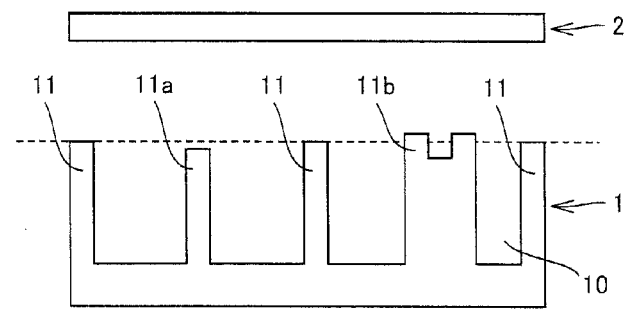
FIG. 28A is a schematic sectional view showing a step of manufacturing a conventional microchip in a state before bonding substrates to each other.
Figure 28B:
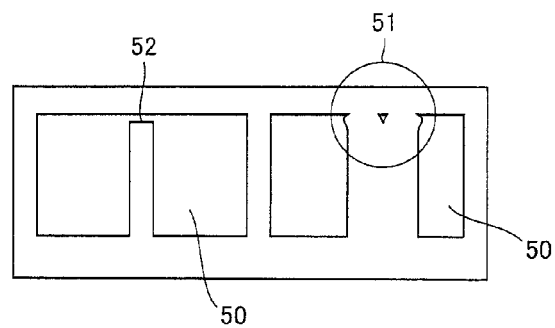
FIG. 28B is a schematic sectional view showing another step of manufacturing the conventional microchip in a state after bonding the substrates to each other.

FIGS. 12A and 12B are schematic sectional views showing steps of manufacturing the microchip according to the third embodiment in states before and after bonding first and second substrates 1 and 2 to each other. As shown in FIG. 12A, recess portion (groove) 10 for forming a fluid circuit is provided on one surface of first substrate 1, and planar second substrate 2 is bonded to the side of first substrate 1 provided with recess portion 10. Partitions 11 dividing recess portion 10 may include partitions 11a and 11b lower and higher than remaining partitions 11, due to sinking or the like in molding of first substrate 1. However, welding ribs 30 are formed on bonded surfaces of partitions 11, 11a and 11b so that first and second substrates 1 and 2 are bonded to each other through welding ribs 30 as shown in FIG. 12B, whereby a process margin in the bonding step is large and formation of defectively bonded portion 52 and deformed portion 51 is suppressed, dissimilarly to the conventional microchip shown in FIG. 28B.

Figure 13:
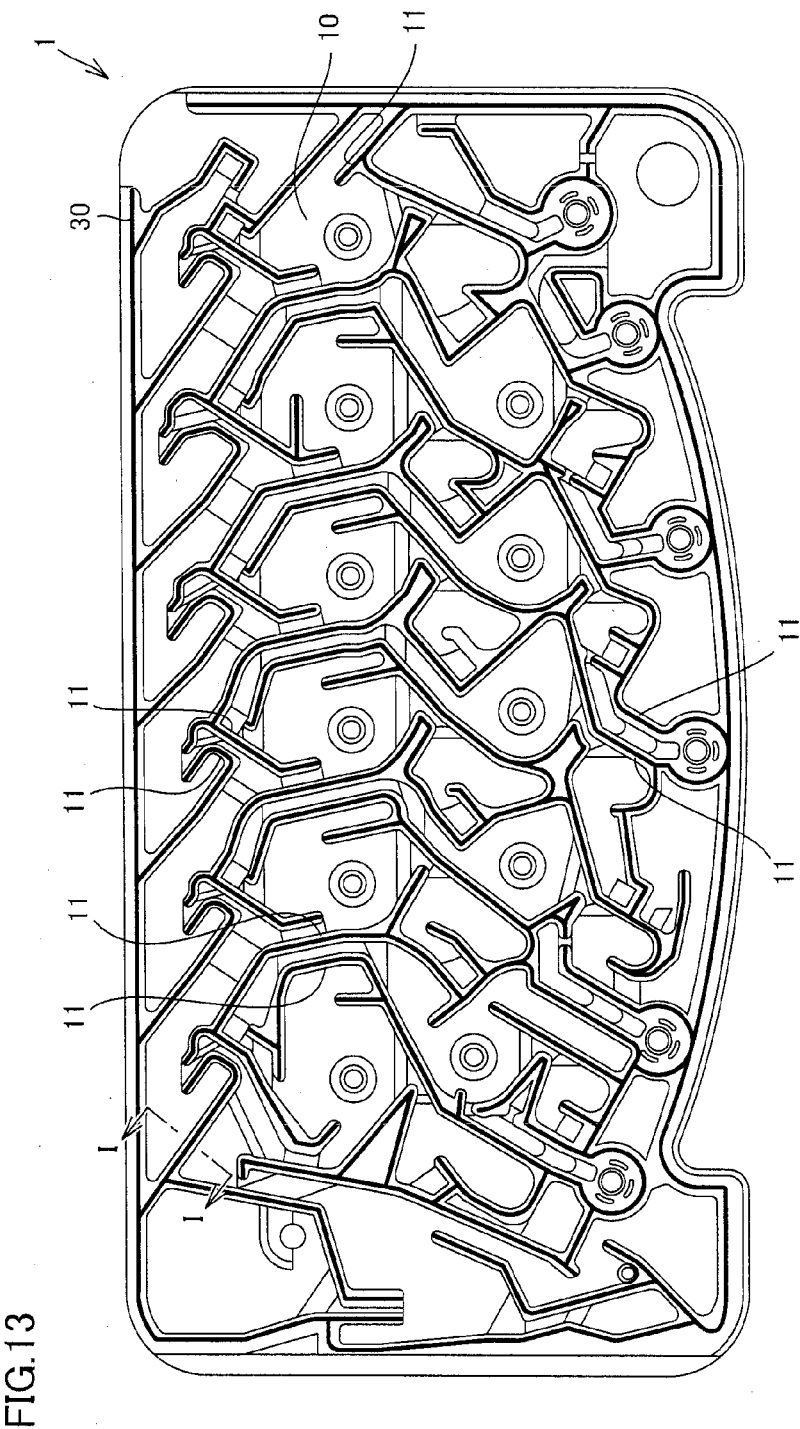
FIG. 13 is a top plan view showing a first substrate, not yet bonded to a second substrate, employed for the microchip according to the third embodiment of the present invention.

FIG. 13 is a top plan view showing first substrate 1, not yet bonded to second substrate 2, employed for the microchip according to the third embodiment. The shapes of partitions 11 of first substrate 1 are so designed as to form desired recess portion 10, and welding ribs 30 are provided on partitions 11.

The material for welding ribs 30 is preferably identical to at least that for first substrate 1, in consideration of the molding step for first substrate 1. However, the material for welding ribs 30 may be different from that for first substrate 1, and welding ribs 30 may be made of a material softer than or higher in viscosity than the material for first substrate 1, for example.

Welding ribs 30, provided substantially on all partitions 11 in FIG. 13, may simply be provided on at least partial forward ends (in the thickness direction of first substrate 1) of partitions 11 of first substrate 1, and may not necessarily be provided on forward ends of all partitions 11.

Figure 14:
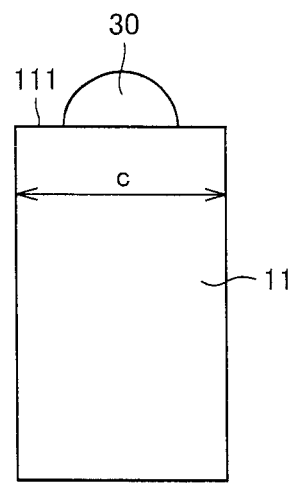
FIG. 14 is a schematic sectional view taken along the line I-I in FIG. 13.

FIG. 14 is a schematic sectional view taken along the line I-I in FIG. 13. Welding rib 30 having a semicircular section is provided on a bonded surface 111 of partition 11 of first substrate 1.

Fourth Embodiment

A microchip according to a fourth embodiment of the present invention is provided with a liquid movement preventing stopper for preventing a liquid in a prescribed site of a fluid circuit from moving to another site. The remaining points of the microchip according to the fourth embodiment are similar to those of the microchip according to the third embodiment.

Figure 15:
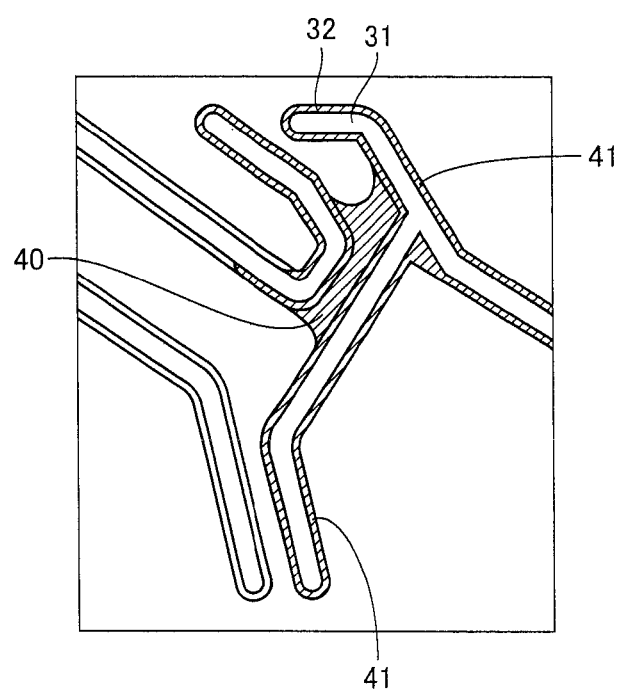
FIG. 15 is a schematic top plan view for illustrating effects of a microchip according to a fourth embodiment of the present invention.
Figure 16:
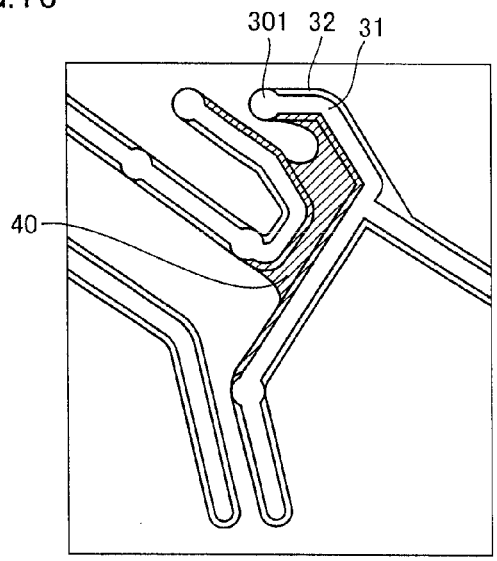
FIG. 16 is a schematic top plan view showing the microchip according to the fourth embodiment of the present invention.

When first and second substrates 1 and 2 are bonded to each other through welding ribs 30 as in the aforementioned third embodiment, a clearance 32 may result from defective crushing of a welding rib 31 (see FIG. 12B), and a liquid which must remain in a prescribed site of the fluid circuit may move to another site through clearance due to capillarity. In other words, a clearance 32 resulting from defective crushing of a welding rib 31 may form a fine channel along the periphery of welding rib 31, as shown in a schematic top plan view of FIG. 15. A liquid 40 which must remain in the prescribed site of the fluid circuit may move to another site through the fine channel (clearance 32), similarly to a liquid 41. Such movement of liquid 40 hinders control of liquid movement in the fluid circuit, and disables correct testing.

Therefore, the microchip according to the fourth embodiment is provided with a liquid movement preventing stopper 301 for dividing the fine channel (clearance 32) and preventing liquid 40 from moving to another site, as shown in FIG.

16. More specifically, liquid movement preventing stopper 301 is a portion, longer than the remaining portion in the thickness direction of a partition, provided on part of welding rib 31. The material for liquid movement preventing stopper 301 is preferably identical to that for welding rib 31, in consideration of a molding step for first substrate 1. However, the material for liquid movement preventing stopper 301 may alternatively be different from that for welding rib 31.

FIGS. 17A, 17B and 18 to 23 are perspective views showing exemplary shapes of a welding rib 30 employed for forming liquid movement preventing stopper 301 in the microchip according to the fourth embodiment. FIGS. 17A, 17B and 18 to 23 show the exemplary shapes of welding rib 30 in a state before first and second substrates 1 and 2 are bonded to each other.

Figure 17A:
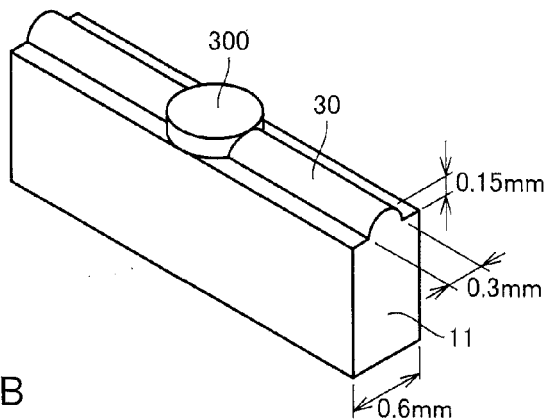
FIG. 17A is a perspective view showing an exemplary shape of a welding rib employed for the microchip according to the fourth embodiment of the present invention.
Figure 17B:
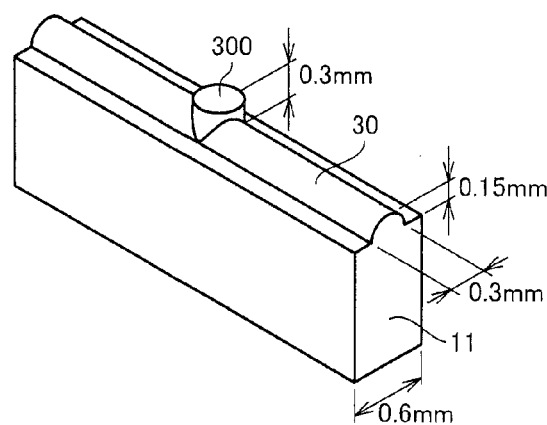
FIG. 17B is a perspective view showing another exemplary shape of the welding rib employed for the microchip according to the fourth embodiment of the present invention.

An additional portion 300 of welding rib 30 shown in FIG. 17A is provided in a columnar shape having a height of 0.15 mm, which is identical to that of welding rib 30 having a semicircular section of 0.15 mm in radius. The diameter of the circular portion forming the columnar shape is substantially identical to the thickness (0.6 mm) of a partition 11. In other words, additional portion 300 is longer than the remaining portion in the thickness direction of partition 11. An additional portion 300 of welding rib 30 shown in FIG. 17B is provided in a columnar shape having a height of 0.3 mm larger than the height (0.15 mm) of welding rib 30. The diameter of the circular portion forming the columnar shape is substantially identical to the width (0.3 mm) of welding rib 30. In other words, additional portion 300 is longer than the remaining portion in the thickness direction of partition 11. Additional portion 300 of welding rib 30 may alternatively be longer than the remaining portion in the thickness direction and the height direction of partition 11, although this structure is not shown.

Such additional portion 300 of welding rib 30 is crushed in the bonding step for first and second substrates 1 and 2 and liquid movement preventing stopper 301 is provided on a bonded surface of partition 11 of first substrate 1. Even if a fine channel (clearance) results from defective crushing of welding rib 30 when first and second substrates 1 and 2 are bonded to each other, therefore, the fine channel is so divided that liquid 40 which must remain in the prescribed site can be prevented from moving to another site.

Figure 18:
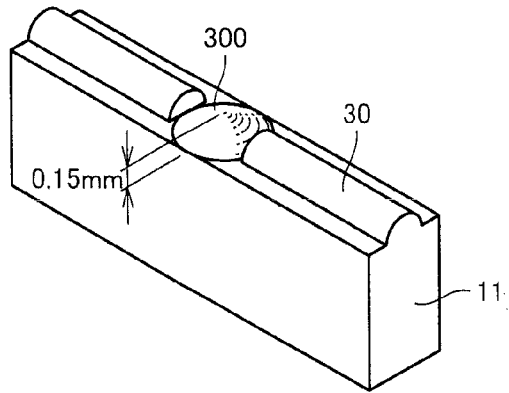
FIG. 18 is a perspective view showing still another exemplary shape of the welding rib employed for the microchip according to the fourth embodiment of the present invention.

However, additional portion 300 of welding rib 30 shown in FIG. 17A or 17B may hinder proper crushing of welding rib 30 when first and second substrates 1 and 2 are bonded to each other. In consideration of this point, an additional portion (longer than the remaining portion in the thickness direction of a partition 11) 300 of a welding rib 30 may have a conical shape, as shown in FIG. 18. Welding rib 30 and additional portion 300 may conceivably be substantially identically easily crushed when first and second substrates 1 and 2 are bonded to each other, due to the conical shape of additional portion 300.

Figure 19:
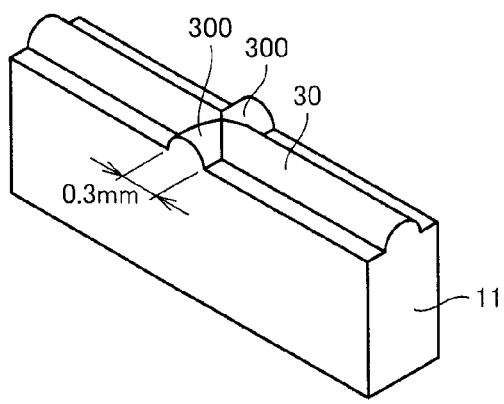
FIG. 19 is a perspective view showing a further exemplary shape of the welding rib employed for the microchip according to the fourth embodiment of the present invention.
Figure 20:
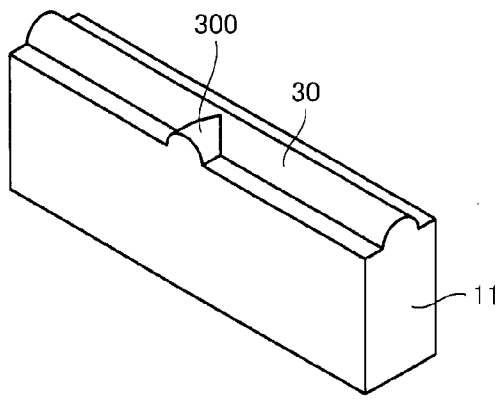
FIG. 20 is a perspective view showing a further exemplary shape of the welding rib employed for the microchip according to the fourth embodiment of the present invention.

Additional portions (longer than the remaining portion in the thickness direction of a partition 11) 300 of a welding rib 30 shown in FIG. 19 are similar in shape to welding rib 30, and provided on both sides of welding rib 30. Such additional portions 300 may not necessarily be provided on both sides of welding rib 30 depending on the design of a fluid circuit, but an additional portion 300 may be provided only on one side of a welding rib 30, as shown in FIG. 20. Alternatively, a plurality of additional portions 300 may be provided in order to improve a liquid movement preventing effect, as shown in FIG. 21.

Figure 21:
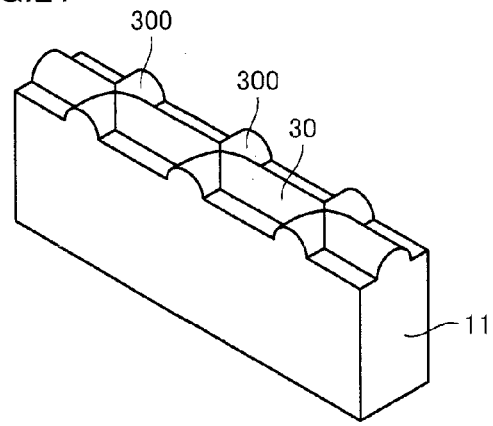
FIG. 21 is a perspective view showing a further exemplary shape of the welding rib employed for the microchip according to the fourth embodiment of the present invention.
Figure 22:
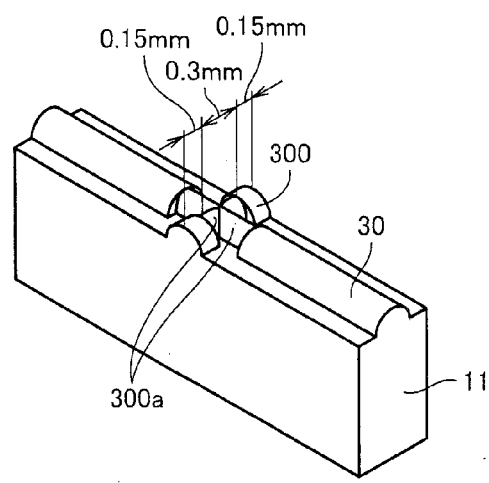
FIG. 22 is a perspective view showing a further exemplary shape of the welding rib employed for the microchip according to the fourth embodiment of the present invention.

However, additional portion(s) 300 of the shape shown in each of FIGS. 19 to 21 may also hinder proper crushing of welding rib 30 when first and second substrates 1 and 2 are bonded to each other. In consideration of this point, notches 300a may be partially provided on an additional portion 300, as shown in FIG. 22. A welding rib 30 and additional portion 300 may conceivably be substantially identically easily crushed when first and second substrates 1 and 2 are bonded to each other, due to the shape of additional portion 300.

Figure 23:
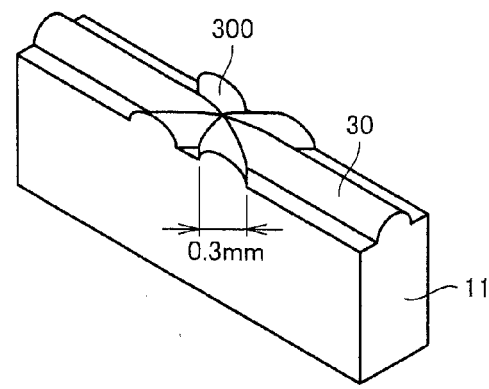
FIG. 23 is a perspective view showing a further exemplary shape of the welding rib employed for the microchip according to the fourth embodiment of the present invention.

Alternatively, additional portions (longer than the remaining portion in the thickness direction of a partition 11) 300 similar in shape to a welding rib 30 may be provided obliquely to partition 11, as shown in FIG. 23. An effect of preventing movement of a liquid is conceivably improved due to such arrangement of additional portions 300. Part of a liquid movement preventing stopper shown in FIG. 23 may be omitted in response to the design of a fluid circuit.

Fifth Embodiment

In a microchip according to a fifth embodiment of the present invention, positioning steps 12 formed by protrusions higher than remaining portions of partitions 11 and lower than forward ends of welding ribs 30 are provided on partial partitions 11 of a first substrate 1 before a bonding step. The remaining points of the microchip according to the fifth embodiment are similar to those of the microchip according to the third embodiment.

Figure 24A:
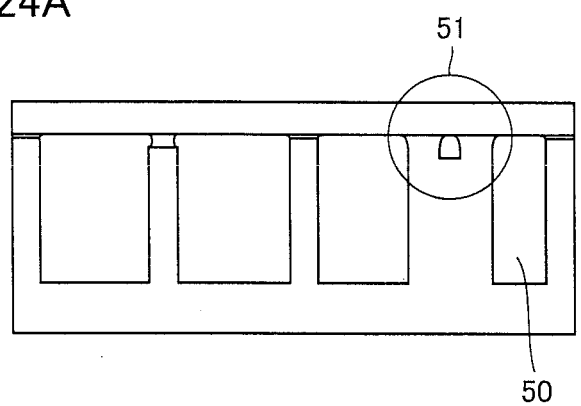
FIG. 24A is a schematic sectional view for illustrating effects of a microchip according to a fifth embodiment of the present invention through an exemplary state after bonding substrates to each other.
Figure 24B:
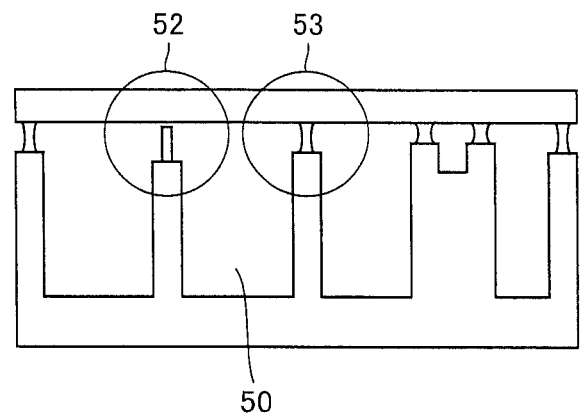
FIG. 24B is a schematic sectional view for illustrating the effects of the microchip according to the fifth embodiment of the present invention through another exemplary state after bonding the substrates to each other.

If precision in positional relation between first and second substrates 1 and 2 bonded to each other through welding ribs 30 as in the aforementioned third embodiment is low in the step of bonding first and second substrates 1 and 2, a deformed portion 51 may be formed by excessive welding as shown in FIG. 24A or incompletely and insufficiently bonded portions 52 and 53 may be formed as shown in FIG. 24B, leading to insufficient division of a fluid circuit 50 (recess portion 10).

Figure 25A:
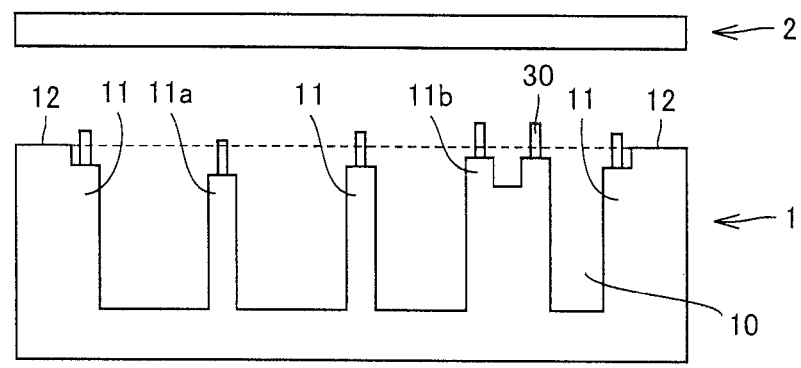
FIG. 25A is a schematic sectional view showing the microchip according to the fifth embodiment of the present invention in the state before bonding the substrates to each other.
Figure 25B:
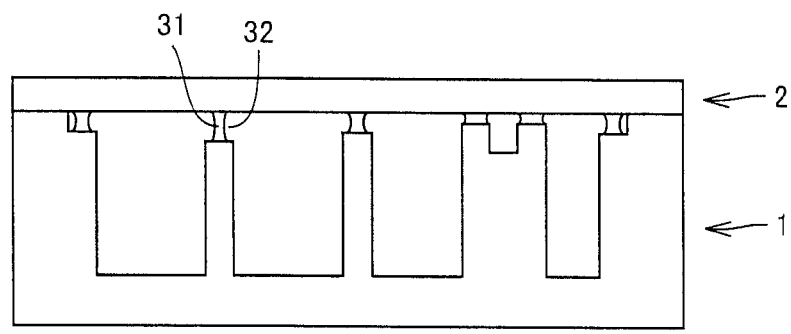
FIG. 25B is a schematic sectional view showing the microchip according to the fifth embodiment of the present invention in the state after bonding the substrates to each other.

Therefore, the microchip according to the fifth embodiment is provided with positioning steps 12, as shown in FIG. 25A. Positioning steps 12 are formed by the protrusions higher than the remaining portions of partitions 11 and lower than the forward ends of welding ribs 30 provided on partial partitions 11 of first substrate 1 before the bonding step. Positioning steps 12 are so provided as to properly maintain the interval between first substrate 1 and a second substrate 2 after the bonding step as shown in FIG. 25B, whereby formation of deformed portion 51 (see FIG. 24A) or incompletely and insufficiently bonded portions 52 and 53 (see FIG. 24B) can be suppressed. Positioning steps 12 provided on partitions 11 positioned on end portions may alternatively be provided on other partitions 11.

Figure 26:
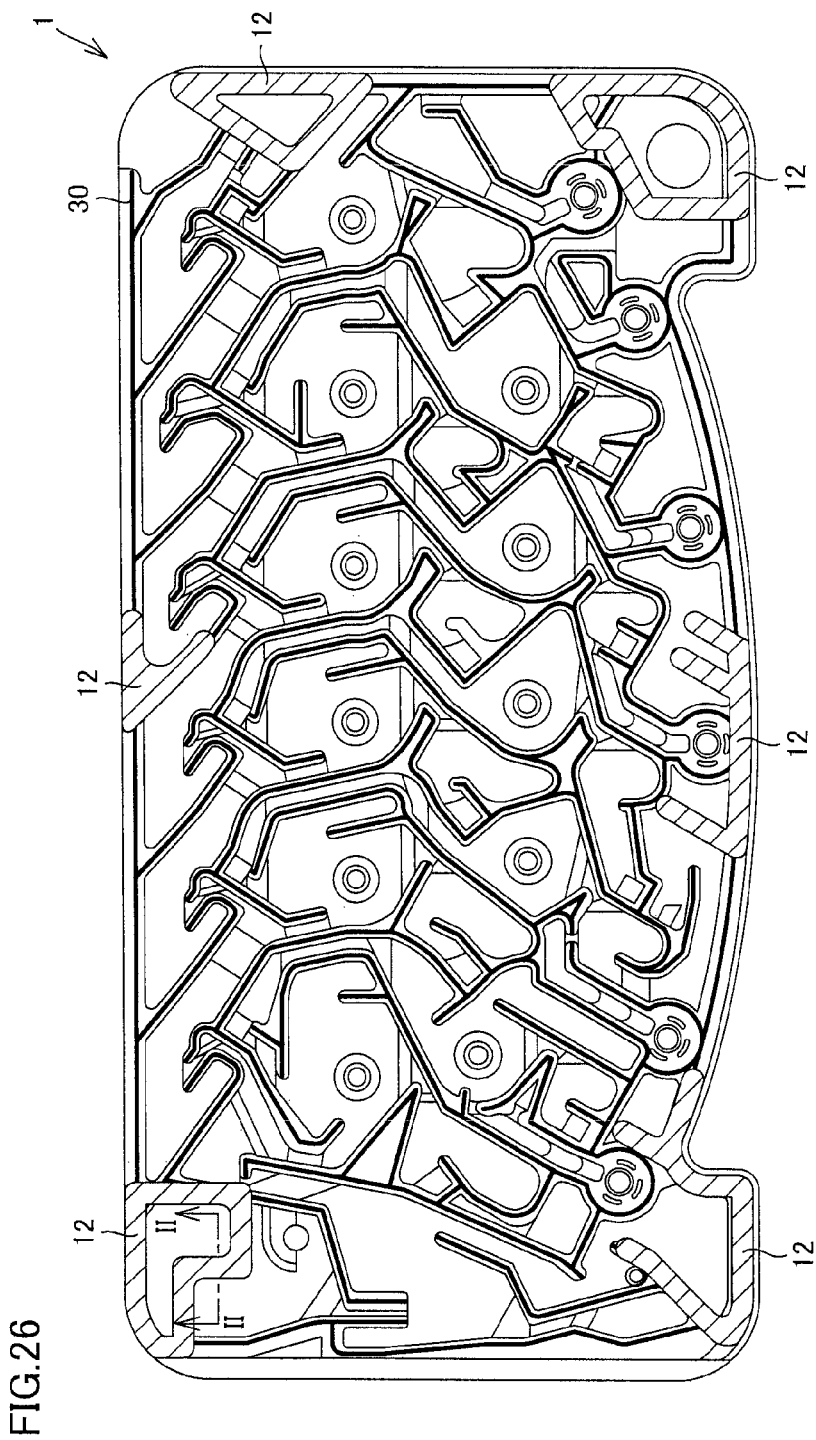
FIG. 26 is a top plan view showing a first substrate, not yet bonded to a second substrate, employed for the microchip according to the fifth embodiment of the present invention.

FIG. 26 is a top plan view showing first substrate 1, not yet bonded to second substrate 2, employed for the microchip according to the fifth embodiment. First substrate 1 is similar to first substrate 1 shown in FIG. 13, except that the same is provided with positioning steps 12.

Figure 27:
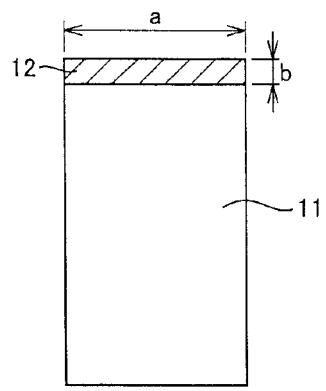
FIG. 27 is a schematic sectional view taken along the line II-II in FIG. 26.

FIG. 27 is a schematic sectional view taken along the line II-II in FIG. 26. Positioning step 12 is provided on a bonded surface of partition 11 of first substrate 1. The thickness a of partition 11 shown in FIG. 27 and the thickness c of partition 11 shown in FIG. 14 are generally different from each other. Assuming that b represents the height of positioning step 12 shown in FIG. 27, a sectional area (area of the semicircular section of welding rib 30 shown in FIG. 14, for example) of a welding rib 31 is preferably substantially equal to c×b. The height b of positioning step 12 is so set in this manner that welding rib 31 spreads on the bonded surface neither too much nor too little in the thickness direction of partition 11 after the bonding step, to be in a proper shape.

Also in this case, however, the heights of partitions 11 forming recess portion 10 may be nonuniform due to sinking or the like in molding of first substrate 1, and a clearance 32 may result from defective crushing of welding rib 31 when first and second substrates 1 and 2 are bonded to each other through welding rib 31 (see FIG. 25B). In order to prevent a liquid in a prescribed site of a fluid circuit from moving to another site due to capillarity, therefore, a liquid movement preventing stopper is preferably provided on the microchip, similarly to the fourth embodiment.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A microchip, comprising a fluid circuit consisting of a space formed therein, moving a liquid present in said fluid circuit to a desired position in said fluid circuit, including a light-absorbing first substrate and a light-transmitting second substrate bonded onto said first substrate, and further including a groove, having a V-shaped section, extending parallelly to said fluid circuit on a surface of said second substrate opposite to said first substrate on a position immediately above at least part of said fluid circuit.

2. The microchip according to claim 1, wherein both end portions of said groove in the width direction are positioned immediately above bonded portions where said first substrate and said second substrate are in contact with each other.

3. The microchip according to claim 1, wherein said V-shaped section of said groove is in the form of an isosceles triangle, and satisfies the following expression (1):

$$L=[a\cdot\tan(\theta-\theta')]/[1+\tan\theta\cdot\tan(\theta-\theta')] \quad (1)$$

where L represents ½ of the distance between both end portions of said groove in the width direction, a represents the distance from a surface of said second substrate provided with said groove to said fluid circuit, and θ represents an angle formed by a straight line connecting said both end portions of said groove in the width direction with each other and inclined surfaces constituting said groove. θ' represents an angle satisfying the following expression (2):

$$\sin\theta/\sin\theta'=n/1 \quad (2)$$

where n represents the refractive index of said second substrate.

4. A method of manufacturing the microchip according to claim 1, comprising the steps of:

arranging said second substrate on said first substrate;

welding said first substrate and said second substrate to each other by applying light to the side of said second substrate from a direction perpendicular to said surface of said second substrate opposite to said first substrate.

5. A microchip, comprising a fluid circuit consisting of a space formed therein, moving a liquid present in said fluid circuit to a desired position in said fluid circuit, including a light-absorbing first substrate and a light-transmitting second substrate bonded onto said first substrate, wherein said fluid circuit consists of a space formed by a groove provided on a surface of said second substrate closer to said first substrate and said first substrate, and the microchip further comprises a tapered structure portion including a protrusion having a sectional shape of an isosceles triangle and an apical angle of 90°.

6. The microchip according to claim 5, wherein said tapered structure portion is formed by parallelly arraying a plurality of protrusions in the form of triangular prisms having sectional shapes of isosceles triangles and apical angles of 90°.

7. The microchip according to claim 5, wherein said tapered structure portion is formed by adjacently arraying a plurality of protrusions in the form of quadrangular pyramids having sectional shapes of isosceles triangles and apical angles of 90°.

8. The microchip according to claim 5, further including a groove, having a V-shaped section, extending parallelly to said fluid circuit on another surface of said second substrate opposite to said first substrate on a position immediately above at least part of said fluid circuit.

9. A method of manufacturing the microchip according to claim 5, comprising the steps of:

arranging said second substrate on said first substrate; and welding said first substrate and said second substrate to each other by applying light to the side of said second substrate from a direction perpendicular to said surface of said second substrate opposite to said first substrate.

10. A microchip comprising a first substrate having a recess portion divided by a partition on at least a first surface and a second substrate bonded onto at least said first surface of said first substrate, and including a fluid circuit constituted of said recess portion and a surface of said second substrate, wherein at least part of a forward end of said partition of said first substrate dividing said recess portion is welded to said second substrate through a welding rib.

11. The microchip according to claim 10, wherein said welding rib partially has a liquid movement preventing stopper longer than the remaining portion in the thickness direction of said partition.

\* \* \* \* \*